United States Patent
Baumann et al.

(10) Patent No.: US 7,442,486 B2
(45) Date of Patent: Oct. 28, 2008

(54) RADIATION-SENSITIVE COMPOSITIONS COMPRISING OXAZOLE DERIVATIVES AND IMAGEABLE ELEMENTS BASED THEREON

(75) Inventors: Harald Baumann, Osterode (DE); Udo Dwars, Herzberg/Harz (DE); Detlef Pietsch, Badenhausen (DE); Michael Flugel, Osterode/Harz (DE)

(73) Assignee: Eastman Kodak Company, Rochester, NY (US)

( * ) Notice: Subject to any disclaimer, the term of this patent is extended or adjusted under 35 U.S.C. 154(b) by 113 days.

(21) Appl. No.: 10/544,758

(22) PCT Filed: Feb. 20, 2004

(86) PCT No.: PCT/EP2004/001706

§ 371 (c)(1),
(2), (4) Date: Apr. 18, 2006

(87) PCT Pub. No.: WO2004/074930

PCT Pub. Date: Sep. 2, 2004

(65) Prior Publication Data

US 2006/0234155 A1    Oct. 19, 2006

(30) Foreign Application Priority Data

Feb. 21, 2003    (DE)    ............................. 103 07 453

(51) Int. Cl.
| G03C 1/76 | (2006.01) |
| G03C 1/492 | (2006.01) |
| G03C 1/494 | (2006.01) |
| G03C 5/00 | (2006.01) |
| G03C 1/00 | (2006.01) |

(52) U.S. Cl. .............. 430/270.1; 430/281.1; 430/286.1; 430/292; 430/294; 430/495.1; 430/541; 548/215; 544/300; 546/271.4

(58) Field of Classification Search .............. 430/270.1, 430/281.1, 286.1, 292, 294, 495.1, 541; 548/215; 544/300; 546/271.4

See application file for complete search history.

(56) References Cited

U.S. PATENT DOCUMENTS 4,371,607 A * 2/1983 Donges .................... 430/281.1
5,025,097 A * 6/1991 Wingen et al. .............. 548/235

FOREIGN PATENT DOCUMENTS

JP    62-180355    8/1987

OTHER PUBLICATIONS

JP Abstract 62180355 (Daicel Chem Ind Ltd).
JP Abstract 62180355 (Daicel Chem Ind Ltd), Jul. 8, 1987.

* cited by examiner

Primary Examiner—Geraldina Visconti
(74) Attorney, Agent, or Firm—J. Lanny Tucker

(57) ABSTRACT

Radiation-sensitive element comprising: (a) one or more types of monomers each comprising at least one ethylenically unsaturated group accessible to a free-radical polymerization, (b) at least one sensitizer, (c) at least one coinitiator capable of forming free radicals together with the sensitizer (b) and selected from the following classes of compounds: metallocenes; 1,3,5-triazine derivatives with one to three $CX_3$ groups, wherein X represents chlorine or bromine; peroxides; hexaarylbiimidazoles; oxime ethers; oxime esters; N-aryl glycines and derivatives thereof; thiol compounds; N-aryl, S-aryl and O-aryl polycarboxylic acids with at least 2 carboxyl groups of which at least one is bonded to the N, S or O atom of the aryl unit; alkyltriarylborates; benzoin ethers; benzoin esters; trihalogenomethylarylsulfones; amines; N,N-dialkylaminobenzoic acid esters; aromatic sulfonyl halides; trihalogenomethylsulfones; imides; diazosulfonates; 9,10-dihydroanthracene derivatives; a-hydroxy and a-amino acetophenones; and (d) optionally one or more components selected from alkali-soluble binders, colorants, exposure indicators, plasticizers, chain transfer agents, leuco dyes, surfactants, inorganic fillers and thermopolymerization inhibitors characterized in that the at least one sensitizer is an oxazole derivative of the formula (I), wherein each $R^1$, $R^2$ and $R^3$ is independently selected from a halogen atom, an optionally substituted alkyl group, an optionally substituted aryl group, which may also be fused, an optionally substituted aralkyl group, a group $-NR^4R^5$ and a group $-OR^6$, wherein $R^4$ and $R^5$ are independently selected from a hydrogen atom, an alkyl, aryl or ralkyl group, $R^6$ is an alkyl, aryl or aralkyl group or a hydrogen atom and k, m and n are independently 0 or an integer from 1 to 5.

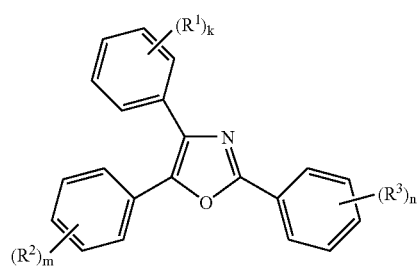

(I)

15 Claims, No Drawings

RADIATION-SENSITIVE COMPOSITIONS COMPRISING OXAZOLE DERIVATIVES AND IMAGEABLE ELEMENTS BASED THEREON

The present invention relates to radiation-sensitive compositions, in particular radiation-sensitive compositions comprising oxazole derivatives as sensitizers. The invention furthermore relates to imageable elements based thereon, a process for the production of such elements, a process for imaging such elements and an imaged element such as for example a lithographic printing plate.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source. Alternatively, the plate can also be exposed digitally without a film, e.g. with a UV laser. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Photosensitive mixtures have been used for years in photopolymerizable compositions for the production of photosensitive materials such as e.g. printing plate precursors. However, an improved sensitivity in particular in the near UV and the visible spectral range is required for new and advanced applications (e.g. exposure by means of lasers) so that the exposure time can be shortened. From an economic point of view it is also important that low-intensity radiation sources can be used, which are less expensive and more reliable than high-intensity radiation sources. Therefore, efforts have been made for some time to increase the sensitivity of photosensitive mixtures to be used in photopolymerizable compositions.

DE-A-3021599 discloses radiation-sensitive compositions comprising ethylenically unsaturated monomers as well as a 2-(halogenomethyl-phenyl)-4-halogen-oxazole derivative as photoinitiator. However, the efficiency of the photoinitiator is insufficient. DE-A-3907666 also describes radiation-sensitive compositions containing a halogen substituted oxazole; again the sensitivity of such a system is too low compared to today's standards.

U.S. Pat. No. 3,597,343 discloses azole compounds as photopolymerization initiators, however, based on today's standards the sensitivity of compositions containing such initiators is too low. In said patent also compositions additionally containing photo-oxidation sensitizers like Rose Bengale and Eosine are described; however, due to the presence of said dyes, the compositions not only suffer from insufficient sensitivity but also poor stability under yellow light conditions.

U.S. Pat. No. 3,912,606 describes UV-hardenable compositions for films and coatings which in addition to ethylenically unsaturated monomers comprise a photoinitiator selected from haloalkane benzoxazoles, benzimidazoles and benzothiazoles. In these compositions as well, the efficiency of the photoinitiator is insufficient.

EP-A-0 741 333 describes photopolymerizable compositions which in addition to ethylenically unsaturated monomers and organic binders comprise a combination of an optical brightener and a photoinitiator selected from acyl and diacyl phosphine oxides. As optical brighteners, those comprising a stilbene, triazine, thiazole, benzoxazole, coumarin, xanthene, triazole, oxazole, thiophene or pyrazoline unit are listed. However, based on today's standards, these photopolymerizable compositions do not exhibit sufficient sensitivity.

U.S. Pat. No. 3,647,467 describes "photo-activable" compositions comprising a hexaarylbiimidazole and a heterocyclic compound $Ar^1$-G-$Ar^2$ (wherein $Ar^1$ is an aryl group with 6 to 12 ring carbon atoms, $Ar^2$ is either $Ar^1$ or a group arylene-G-$Ar^1$ and G is a divalent furan, oxazole or oxadiazole ring). However, the radiation sensitivity of these compositions does not meet present-day requirements.

In documents DE-OS-1120875 and EP-A-0 129059, oxazole derivatives are used as photoconductive substances in electrophotographic elements.

In U.S. Pat. No. 3,652,275, 2-mercaptobenzoxazoles are used as chain extension agents in "photo-activable" compositions comprising hexaarylbiimidazole and bis (p-aminophenyl . . . -α,β-unsaturated) ketones. In this combination as well, the obtained photosensitivity is too low.

It is the object of the present invention to provide radiation-sensitive compositions resulting in radiation-sensitive elements exhibiting high photosensitivity in combination with good storage stability and good stability under yellow light conditions, and—in the case of printing plates—yielding a large number of copies on the printing machine.

This object is achieved by a radiation-sensitive composition comprising (a) one or more types of monomers and/or oligomers and/or polymers, each comprising at least one ethylenically unsaturated group accessible to a free-radical polymerization, (b) at least one sensitizer, (c) at least one coinitiator capable of forming free radicals together with the sensitizer (b) and selected from the following classes of compounds: metallocenes; 1,3,5-triazine derivatives with one to three $CX_3$ groups, wherein X represents chlorine or bromine; peroxides; hexaarylbiimidazoles; oxime ethers; oxime esters; N-aryl glycines and derivatives thereof; thiol compounds; N-aryl, S-aryl and O-aryl polycarboxylic acids with at least 2 carboxyl groups of which at least one is bonded to the N, S or O atom of the aryl unit; alkyltriarylborates; benzoin ethers; benzoin esters; trihalogenomethyl-arylsulfones; amines; N,N-dialkylaminobenzoic acid esters; aromatic sulfonyl halides; trihalogenomethylsulfones; imides; diazosulfonates; 9,10-dihydro-anthracene derivatives; α-hydroxy and α-amino acetophenones; and (d) optionally one or more components selected from alkali-soluble binders, colorants, exposure indicators, plasticizers, chain transfer agents, leuco dyes, surfactants, inorganic fillers and thermopolymerization inhibitors characterized in that the at least one sensitizer is an oxazole derivative of the formula (I)

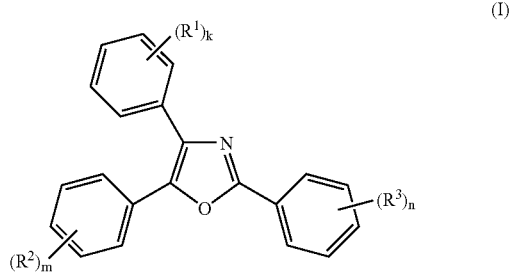

wherein each $R^1$, $R^2$ and $R^3$ is independently selected from a halogen atom, an optionally substituted alkyl group, an optionally substituted aryl group, which may also be fused, an optionally substituted aralkyl group, a group —$NR^4R^5$ and a group —$OR^6$, wherein $R^4$ and $R^5$ are independently selected from a hydrogen atom, an alkyl, aryl or aralkyl group, $R^6$ is an optionally substituted alkyl, aryl or aralkyl group or a hydrogen atom, and k, m and n are independently 0 or an integer from 1 to 5.

Unless defined otherwise, the term "alkyl group" as used in the present invention refers to a straight-chain, branched or cyclic saturated hydrocarbon group preferably comprising 1 to 18 carbon atoms, especially preferred 1 to 10 carbon atoms and most preferred 1 to 6 carbon atoms. The alkyl group can optionally comprise one or more substituents (preferably 0 or 1 substituent) selected for example from halogen atoms (fluorine, chlorine, bromine, iodine), CN, $NO_2$, $NR'_2$, COOR' and OR' (R' independently represents a hydrogen atom or an alkyl group). The above definition also applies to the alkyl unit of an aralkyl group and an alkoxy group.

Unless defined otherwise, the term "aryl group" as used in the present invention refers to an aromatic carbocyclic group with one or more fused rings, which preferably comprises 5 to 14 carbon atoms. The aryl group can optionally comprise one or more substituents (preferably 0 to 3) selected for example from halogen atoms, alkyl groups, alkoxy groups, CN, $NO_2$, $NR'_2$, COOR' and OR' (wherein each R' is independently selected from hydrogen and alkyl). The above definition also applies to the aryl unit of an aralkyl group. Preferred examples include a phenyl group and a naphthyl group which can optionally be substituted.

A fused ring or ring system as referred to in the present invention is a ring that shares two carbon atoms with the ring to which it is fused.

All monomers, oligomers and polymers which are free-radical polymerizable and comprise at least one C—C double can be used as ethylenically unsaturated monomers, oligomers and polymers. Monomers, oligomers and polymers with C—C triple bonds can also be used, but they are not preferred. Suitable compounds are well known to the person skilled in the art and can be used in the present invention without any particular limitations. Esters of acrylic and methacrylic acids, itaconic acid, crotonic acid, isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and methacrylate, pentaerythritol triacrylate and methacrylate, dipentaerythritolmonohydroxy pentaacrylate and methacrylate, dipentaerythritol hexaacrylate and methacrylate, pentaerythritol tetraacrylate and methacrylate, ditrimethylol propane tetraacrylate and methacrylate, diethyleneglycol diacrylate and methacrylate, triethyleneglycol diacrylate and methacrylate or tetraethyleneglycol diacrylate and methacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride olefin copolymers and hydroxyalkyl(meth)acrylates (cf. e.g. DE-A-4311738); (meth)acrylic acid polymers, partially or fully esterified with allyl alcohol (cf. e.g. DE-A-3332640); reaction products of polymeric polyalcohols and isocyanato (meth)acrylates; unsaturated polyesters; (meth)acrylate-terminated polystyrenes, poly(meth)acrylic acid ester, poly (meth)acrylic acids, poly(meth)acrylamides; (meth)acrylic acid polymers, partially or fully esterified with epoxides comprising free-radical polymerizable groups; and polyethers. In this connection, the prefix "(meth)" indicates that both derivatives of acrylic acid and of methacrylic acid can be used.

Additional suitable C—C unsaturated free-radical polymerizable compounds are described e.g. in EP-A-1 176 007.

It is of course possible to use different kinds of monomers, oligomers or polymers in the mixture; furthermore, mixtures of monomers and oligomers and/or polymers can be used in the present invention, as well as mixtures of oligomers and polymers. The free-radical polymerizable monomers/oligomers/polymers are preferably present in an amount of 5 to 95 wt.-%; if monomers/oligomers are used, especially preferred 20 to 85 wt.-%, based on the dry layer weight of a radiation-sensitive coating prepared from the radiation-sensitive composition of the present invention. As used in the present invention, the term "dry layer weight of the radiation-sensitive coating" is therefore synonymous with the term "solids of the radiation-sensitive composition".

A sensitizer as referred to in the present invention is a compound which can absorb radiation when it is exposed to radiation but which cannot by itself, i.e. without the addition of coinitiators, form free radicals.

In the present invention, one sensitizer or a mixture of two or more can be used.

In the present invention, an oxazole compound of formula (I) is used as sensitizer.

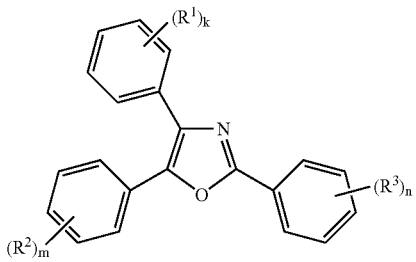

wherein each $R^1$, $R^2$ and $R^3$ is independently selected from a halogen atom, an optionally substituted alkyl group, an optionally substituted aryl group, which may also be fused, an optionally substituted aralkyl group, a group —$NR^4R^5$ and a group —$OR^6$, wherein $R^4$ and $R^5$ are independently selected from a hydrogen atom, an alkyl, aryl or aralkyl $R^6$ is an optionally substituted alkyl, aryl or aralkyl group or a hydrogen atom, and k, m and n are independently 0 or an integer from 1 to 5.

If one or more of $R^1$, $R^2$ and $R^3$ represents an optionally substituted alkyl group, it is preferred that the alkyl group is either unsubstituted or substituted with one substituent selected from CN, $NO_2$, $NR'_2$, COOR' and OR' (R' being hydrogen or alkyl).

Preferably, $R^1$, $R^2$ and $R^3$ are independently selected from a halogen atom, a $C_1$-$C_8$ alkyl and a group —$NR^4R^5$, wherein $R^4$ and $R^5$ are preferably independently selected from hydrogen atoms and $C_1$-$C_6$ alkyl.

k, m and n are preferably independently 0 or 1.

Oxazole derivatives of formula (I) wherein at least one of $R^1$, $R^2$ and $R^3$ represents a group —$NR^4R^5$ wherein $R^4$ and $R^5$ are preferably independently selected from hydrogen atoms and $C_1$-$C_6$ alkyl, and especially preferred $R^4$=$R^5$=$C_1$-$C_6$ alkyl, are especially preferred.

The oxazole derivatives used in the present invention can be prepared according to processes well known to the person skilled in the art. In this connection, reference is made to DE-A-1120875 and EP-A-129 059; the processes described in these documents can also be used for the synthesis of oxazoles not explicitly described therein by varying the starting compounds accordingly.

The sensitizers are used in combination with one or more coinitiators.

The amount of sensitizer(s) is not particularly restricted; however, it is preferably in the range of 0.2 to 25 wt.-%, based on the solids content or the dry layer weight of a coating produced from the composition, especially preferred 0.5 to 15 wt.-%.

A coinitiator as referred to in the present invention is a compound that is essentially unable to absorb when exposed to radiation but forms free radicals together with the radiation-absorbing sensitizers used according to the present invention. According to the present invention, the coinitiators are selected from amines, such as alkanols amines; N,N-dialkylaminobenzoic acid esters; N-arylglycines and derivatives thereof (e.g. N-phenylglycine); aromatic sulfonylhalides, trihalogenomethylsulfones; imides such as N-benzoyloxyphthalimide; diazosulfonates; 9,10-dihydroanthracene derivatives; N-aryl, S-aryl or O-aryl polycarboxylic acids with at least 2 carboxyl groups of which at least one is bonded to the nitrogen, oxygen or sulfur atom of the aryl unit (e.g. aniline diacetic acid and derivatives thereof and other coinitiators described in U.S. Pat. No. 5,629,354); a hexaarylbiimidazole such as e.g. 2,2-bis-(2-chlorophenyl)-4,5,4',5'-tetraphenyl-2'H -[1,2']biimidazole and 2,2',5-tris(2-chlorophenyl)-4-(3,4-dimethoxyphenyl)-4,5'-diphenylbi-imidazole; thiol compounds (e.g. mercaptobenzthiazole, mercaptobenzimidazole and mercaptotriazole); 1,3,5-triazine derivatives with 1 to 3 $CX_3$ groups (wherein every X is independently selected from a chlorine or bromine atom, and is preferably a chlorine atom) such as e.g. 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, and 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine; oxime ethers and oxime esters, such as those derived from benzoin; α-hydroxy or α-amino-acetophenones; alkyltriarylborates; trihalogenomethylarylsulfones; benzoin ethers and benzoin esters; metallocenes (preferably titanocenes, and especially preferred those with two five-membered cyclodienyl groups, such as e.g. cyclopentadienyl groups and one or two six-membered aromatic groups with at least one ortho fluorine atom and optionally also a pyrryl group, such as bis(cyclopentadienyl)-bis-[2,6-difluoro-3-(pyrr-1-yl)-phenyl]titanium and dicyclopentadiene-bis-2,4,6-trifluorophenyl-titanium or zirconium), and peroxides (e.g. those listed in EP-A-1 035 435 as activators of the type of an organic peroxide).

Acylphosphine oxides and diacylphosphine oxides have been found to be unsuitable coinitiators for the oxazole sensitizers.

In the present invention, one of the above coinitiators or a mixture thereof can be used.

The amount of coinitiator(s) is not particularly restricted; however, it is preferably 0.2 to 25 wt.-%, based on the dry layer weight, especially preferred 0.5 to 15 wt.-%.

Optionally, the radiation-sensitive coating can also comprise one or more onium salts as additional coinitiators; for example ammonium salts, diaryliodonium salts, triarylsulfonium salts, aryldiazonium salts and N-alkoxypyridinium salts. They are preferably present in an amount of 0 to 15 wt.-%, based on the dry layer weight.

Optionally, the photosensitive composition of the present invention can also comprise a binder or a mixture of binders. The binder is preferably selected from polyvinyl acetals, acrylic polymers, polyurethanes and copolymers thereof. It is preferred that the binder contain acid groups, especially preferred carboxyl groups. Most preferred are acrylic polymers. Binders with acid groups preferably have acid numbers in the range of 20 to 180 mg KOH/g polymer. Optionally, the binder can comprise groups capable of undergoing a cycloaddition reaction (e.g. photocycloaddition). The amount of binder is not particularly restricted and is preferably in the range of 0 to 90 wt.-%, especially preferred 5 to 60 wt.-%.

The radiation-sensitive coating can optionally also comprise small amounts of a thermopolymerization inhibitor. Suitable examples of inhibitors of undesired thermopolymerization include hydroquinone, p-methoxyphenol, di-t-butyl-p-cresol, pyrrogallol, t-butylcatechol, benzoquinone, 4,4'-thio-bis-(3-methyl-6-t-butylphenol), 2,2'-methylene-bis-(4-methyl-6-t-butylphenol) and N-nitrosophenylhydroxylamine salts. The amount of the non-absorbable polymerization inhibitor in the radiation-sensitive coating is preferably 0 to 5 wt-%, based on the dry layer weight, especially preferred 0.01 to 2 wt.-%. Such inhibitors are often introduced into the radiation-sensitive coating via commercial monomers or oligomers and are therefore not expressly mentioned.

Furthermore, the radiation-sensitive coating of the present invention can comprise dyes or pigments for coloring the layer. Examples of colorants include e.g. phthalocyanine pigments, azo pigments, carbon black and titanium dioxide, ethyl violet, crystal violet, azo dyes, anthraquinone dyes and cyanine dyes. The amount of colorant is preferably 0 to 20 wt.-%, based on the dry layer weight, especially preferred 0.5 to 10 wt.-%.

For improving the physical properties of the hardened layer, the radiation-sensitive coating can additionally comprise further additives such as plasticizers or inorganic fillers. Suitable plasticizers include e.g. dibutyl phthalate, dioctyl phthalate, didodecyl phthalate, dioctyl adipate, dibutyl sebacate, triacetyl glycerin und tricresyl phosphate. The amount of plasticizer is not particularly restricted, however, it is preferably 0 to 10 wt.-%, based on the dry layer weight, especially preferred 0.25 to 5 wt.-%.

The radiation-sensitive coating can also comprise known chain transfer agents. They are preferably used in an amount of 0 to 15 wt.-%, based on the dry layer weight, especially preferred 0.5 to 5 wt.-%.

Furthermore, the radiation-sensitive coating can comprise leuco dyes such as e.g. leuco crystal violet and leucomalachite green. They are preferably present in an amount of 0 to 10 wt.-%, based on the dry layer weight, especially preferred 0.5 to 5 wt.-%.

Additionally, the radiation-sensitive coating can comprise surfactants. Suitable surfactants include siloxane-containing polymers, fluorine-containing polymers and polymers with ethylene oxide and/or propylene oxide groups. They are preferably present in an amount of 0 to 10 wt.-%, based on the dry layer weight, especially preferred 0.2 to 5 wt.-%.

Further optional components of the radiation-sensitive coating include inorganic fillers such as e.g. $Al_2O_3$ and $SiO_2$ (they are preferably present in an amount of 0 to 20 wt.-%, based on the dry layer weight, especially preferred 0.1 to 5 wt.-%).

Exposure indicators, such as e.g. 4-phenylazodiphenylamine, can also be present as optional components of the radiation-sensitive coating; they are preferably present in an amount of 0 to 5 wt.-%, especially preferred 0 to 2 wt.-%, based on the dry layer weight.

The radiation-sensitive elements of the present invention can for example be printing plate precursors (in particular precursors of lithographic printing plates), printed circuit boards for integrated circuits or photomasks.

A dimensionally stable plate or foil-shaped material is preferably used as a substrate in particular in the production of printing plate precursors. Preferably, a material is used as dimensionally stable plate or foil-shaped material that has already been used as a substrate for printing matters. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive and furthermore exhibits excellent adhesion to the coating. Furthermore, a composite film can be used wherein an aluminum foil has been laminated onto a polyethylene terephthalate film.

A metal substrate, in particular an aluminum substrate, is preferably subjected to at least one treatment selected from graining (e.g. by brushing in a dry state or brushing with abrasive suspensions, or electrochemical graining, e.g. by means of a hydrochloric acid electrolyte), anodizing (e.g. in sulfuric acid or phosphoric acid) and hydrophilizing.

In order to improve the hydrophilic properties of the surface of the metal substrate that has been grained and optionally anodized in sulfuric acid or phosphoric acid, the metal substrate can be subjected to an after treatment with an aqueous solution of sodium silicate, calcium zirconium fluoride, polyvinylphosphonic acid or phosphoric acid. Within the framework of the present invention, the term "substrate" also encompasses an optionally pre-treated substrate exhibiting, for example, a hydrophilizing layer on its surface.

The details of the above-mentioned substrate pre-treatment are known to the person skilled in the art.

For producing a radiation-sensitive element, the radiation-sensitive composition of the present invention is applied to the surface of the substrate by means of common processes (e.g. spin coating, dip coating, coating by means of doctor blades). It is also possible to apply the radiation-sensitive composition on both sides of the substrate; however, for the elements of the present invention, it is preferred that the radiation-sensitive coating be only applied to one side of the substrate.

For this purpose, the radiation-sensitive composition comprises one or more organic solvents.

Suitable solvents include low alcohols (e.g. methanol, ethanol, propanol and butanol), glycolether derivatives (e.g. ethyleneglycol monomethylether, ethyleneglycol dimethylether, propyleneglycol monomethylether, ethyleneglycol monomethylether acetate, ethyleneglycol monoethylether acetate, propyleneglycol monomethylether acetate, propyleneglycol monoethylether acetate, ethyleneglycol monoisopropylether acetate, ethyleneglycol monobutylether acetate, diethyleneglycol monomethylether, diethyleneglycol monoethylether), ketones (e.g. diacetone alcohol, acetyl acetone, acetone, methyl ethyl ketone, cyclohexanone, methyl isobutyl ketone), esters (e.g. z.B. methyl lactate, ethyl lactate, ethyl acetate, 3-methoxypropyl acetate and butyl acetate), aromatics (e.g. toluene and xylene), cyclohexane, 3-methoxy-2-propanol, 1-methoxy-2-propanol, methoxymethoxyethanol, γ-butyrolactone and dipolar aprotic solvents (e.g. THF, dimethylsulfoxide, dimethylformamide and N-methylpropyrrolidone). The solids content of the radiation-sensitive mixture to be applied depends on the coating method that is used and is preferably 1 to 50 wt.-%.

The additional application of a water-soluble oxygen-impermeable overcoat onto the radiation-sensitive layer can be advantageous. The polymers suitable for such an overcoat include, inter alia, polyvinyl alcohol, polyvinyl alcohol/polyvinyl acetate copolymers, polyvinyl pyrrolidone, polyvinyl pyrrolidone/polyvinyl acetate copolymers, polyvinyl methylethers, ring-opened copolymers of maleic acid anhydride and a comonomer such as methylvinylether, polyacrylic acid, cellulose ether, gelatin, etc.; polyvinyl alcohol is preferred. Preferably, the composition for the oxygen-impermeable overcoat is applied in the form of a solution in water or in a solvent miscible with water; in any case, the solvent is selected such that the radiation-sensitive coating already present on the substrate does not dissolve. The layer weight of the overcoat can e.g. be 0.1 to 6 $g/m^2$, preferably 0.5 to 6 $g/m^2$. However, the printing plate precursors according to the present invention show excellent properties even without an overcoat. The overcoat can also comprise matting agents (i.e. organic or inorganic particles with a particle size of 2 to 20 µm) which facilitate the planar positioning of the film during contact exposure. In order to improve adhesion of the overcoat to the radiation-sensitive layer, the overcoat can comprise adhesion promoters such as e.g. poly(vinylpyrrolidone), poly(ethyleneimine) and poly(vinylimidazole).

Suitable overcoats are described for example in WO 99/06890.

The thus produced radiation-sensitive elements are imagewise exposed in a manner known to the person skilled in the art with UV radiation of a wavelength of >300 nm (preferably 350 to 450 nm) and subsequently developed with a commercially available aqueous alkaline developer. UV laser diodes emitting UV radiation in the range of about 405 nm (e.g. 405±10 nm) are of particular interest as a radiation source. After image-wise exposure, i.e. prior to developing, a heat treatment can be carried out at 50 to 180° C., preferably 90 to 150° C. The developed elements can be treated with a preservative ("gumming") using a common method. The preservatives are aqueous solutions of hydrophilic polymers, wetting agents and other additives.

For certain applications (e.g. in the case of printing plates), it is furthermore advantageous to increase the mechanical strength of the portions of the coating remaining after developing by subjecting them to a heat treatment (what is referred to as "baking") and/or overall exposure (e.g. to UV light). For this purpose, prior to the treatment, the developed element is treated with a solution that protects the non-image areas such that the heat treatment does not cause these areas to accept ink. A solution suitable for this purpose is e.g. described in U.S. Pat. No. 4,355,096. Baking takes place at a temperature in the range of 150 to 250° C. However, elements as well as printing plates prepared from radiation-sensitive elements according to the present invention show excellent properties even without having been subjected to a heat treatment. When both baking and overall exposure are carried out, the two treatment steps can be performed simultaneously or one after the other.

The radiation-sensitive elements according to the present invention are characterized by excellent stability under yellow light conditions, a high degree of photosensitivity and excellent resolution in combination with good storage stability. In the case of printing plate precursors, the developed printing plates exhibit excellent abrasion resistance which allows a large number of copies.

The invention will be explained in more detail in the following examples.

EXAMPLES

Examples 1 to 3 and Comparative Examples 1 to 6

An electrochemically (in HCl) grained and anodized aluminum foil was subjected to a treatment with an aqueous solution of polyvinyl phosphonic acid (PVPA) and after drying was coated with a solution as described in Table 1 and dried.

TABLE 1

| | |
|---|---|
| 1.02 g | of a terpolymer prepared by polymerization of 470 parts by weight styrene, 336 parts by weight methyl methacrylate and 193 parts by weight methacrylic acid, 30% solution in 1-methoxy-2-propanol |

TABLE 1-continued

| | |
|---|---|
| 0.1 g | Kayamer PM-2 (1 mole phosphoric acid esterified with 1.5 mole hydroxyethyl methacrylate from Coa Corp. Ltd., Japan) |
| 0.2 g | mercapto-3-triazole |
| 3.92 g | of an 80% methyl ethyl ketone solution of a urethane acrylate prepared by reacting Desmodur N 100 ® (available from Bayer) with hydroxyethyl acrylate and pentaerythritol triacrylate; amount of double bonds: 0.5 double bonds per 100 g when all isocyanate groups have completely reacted with the acrylates containing hydroxy groups |
| 0.45 g | ditrimethylolpropane tetraacrylate |
| 1.25 g | of a dispersion in 1-methoxy-2-propanol comprising 7.25 wt.-% copper phthalocyanine and 7.25 wt.-% polyvinylacetal binder comprising 39.9 mole-% vinyl alcohol groups, 1.2 mole-% vinyl acetate groups, 15.4 mole-% acetal groups derived from acetaldehyde, 36.1 mole-% acetal groups derived from butyric aldehyde and 7.4 mole-% acetal groups derived from 4-formylbenzoic acid |
| Y g | coinitiator according to Table 2 |
| X g | sensitizer according to Table 2 |
| 20 ml | propyleneglycol monomethyl ether |
| 16 ml | methanol |
| 25 ml | methyl ethyl ketone |

The solution was filtered, applied to the lithographic substrate and the coating was dried for 4 minutes at 90° C. The dry layer weight of the photopolymer layer was about 1.5 g/m².

The obtained samples were coated with an overcoat by applying an aqueous solution of poly(vinylalcohol) (Airvol 203 available from Airproducts; degree of hydrolysis: 88%); after drying for 4 minutes at 90° C., the overcoat had a dry layer weight of about 3 g/m².

The printing plate precursor was exposed with a tungsten lamp having a metal interference filter for 405 nm through a gray scale having a tonal range of 0.15 to 1.95, wherein the density increments amount to 0.15 (UGRA gray scale) with 1 µW/cm². Immediately after exposure, the plate was heated in an oven for 2 minutes at 90° C.

Then, the exposed plate was treated for 30 seconds with a developer solution comprising the following components:

3.4 parts by weight Rewopol NLS 28® (available from REWO)

1.1 parts by weight diethanol amine 1.0 parts by weight Texapon 842® (available from Henkel)

0.6 parts by weight Nekal BX Paste® (available from BASF)

0.2 parts by weight 4-toluene sulfonic acid and 93.7 parts by weight water

Then the developer solution was again rubbed over the surface for another 30 seconds using a tampon and then the entire plate was rinsed with water. After this treatment, the exposed portions remained on the plate. For the assessment of its photosensitivity, the plate was blackened in a wet state with printing ink.

For the assessment of the storage stability of the plates, the unexposed printing plate precursors were stored for 60 minutes in a 90° C. oven, then exposed and developed as described above (storage stability test).

For the preparation of a lithographic printing plate, a printing layer was applied to the aluminum foil, as explained above, exposed, heated, developed, and after rinsing with water, the developed plate was rubbed with an aqueous solution of 0.5% phosphoric acid and 6% gum arabic. The thus prepared plate was loaded in a sheet-fed offset printing machine and used for printing with an abrasive printing ink (Offset S 7184 available from Sun Chemical, containing 10% potassium carbonate).

The results are summarized in Table 2.

TABLE 2

| Example | Type and amount of sensitizer X | Type and amount of coinitiator Y | Exposure time [sec] | Yellow light safety[11] | Gray scale 405 nm[1] | Gray scale 405 nm[1] 60 min/ 90° C.[2] | Printing results |
|---|---|---|---|---|---|---|---|
| 1 | 0.7 g oxazole 1[3] | 0.19 g o-Cl-Habi[4] | 120 | no remaining coating | 3/6 | 4/6 | no abrasion up to 50,000 copies |
| 2 | 0.7 g oxazole 1[3] | 0.26 g triazine[8] | 360 | no remaining coating | 2/5 | 2/5 | no abrasion up to 50,000 copies |
| 3 | 0.7 g oxazole 1[3] | 0.19 g MeO-Habi[10] | 120 | no remaining coating | 2/4 | 3/6 | no abrasion up to 50,000 copies |
| Comparative 1 | 0.7 g oxazole 1[3] | 0.4 g alkoxypyridinium salt 1[9] | 600 | no remaining coating | 2/4 | 2/4 | abrasion after 50,000 copies |
| Comparative 2 (U.S. Pat. No. 3,597,343) | 0.7 g oxazole 1[3] | — | 600 | no remaining coating | no image obtained | no image obtained | not determined |
| Comparative 3 (U.S. Pat. No. 3,597,343) | — | 0.19 g o-Cl-Habi[4] | 600 | no remaining coating | no image obtained | no image obtained | not determined |
| Comparative 4 (U.S. Pat. No. 3,647,467) | 0.4 g oxadiazole 1[5] | 0.19 g o-Cl-Habi[4] | 120 | no remaining coating | 1/3 | 1/3 | abrasion after 1,000 copies |
| Comparative 5 (U.S. Pat. No. 3,647,467) | 0.4 g oxadiazole 1[5] | 0.26 g iodonium salt 1[8] | 360 | no remaining coating | no image obtained | no image obtained | not determined |
| Comparative 6 (EP 741 333) | 0.2 g oxazole 2[6] | 0.2 g phosphine oxide 1[7] | 600 | no remaining coating | no image obtained | no image obtained | not determined |

[1]The first value indicates the solid steps of the blackened gray scale and the second value indicates the first step that did not accept printing ink.
[2]Storage stability test: Result after 10 minute storage of the unexposed printing plate precursor at 90° C.
[3]2-phenyl-4-(2-chlorophenyl)-5-(4-N,N-diethylaminophenyl)-oxazole-1,3
[4]2,2-bis-(2-chlorophenyl)-4,5,4',5'-tetraphenyl-2'H-[1,2']biimidazolyl
[5]2,5-bis-4,4'-diethylaminophenyl-1,3,4-oxadiazole
[6]2,2'-(2,5-thiophendiyl)bis(tert-butylbenzoxazole)
[7]2,4,6-trimethylbenzoyl-diphenylphosphine oxide
[8]2-(4-methoxyphenyl)-4,6-bis-(trichloromethyl)-1,3,5-triazine
[9]4-phenyl-1-methoxypyridiumtetrafluoroborate
[10]2,2',5-tris(2-chlorophenyl)-4-(3,4-dimethoxyphenyl)-4,5'-diphenylbiimidazole
[11]Yellow light safety was measured by exposure of the plate for 30 min with a yellow light tube G10 from Encapsulite with an intensity of 200 lux. After heating the plate in an oven for 2 minutes at 90° C. the plate was developed as described and checked for remaining coating residues.

It can be seen from Table 2 that by using a combination of a sensitizer of formula (I) and a coinitiator, printing plate precursors with high sensitivity and good storage stability can be obtained, which lead to printing forms allowing a high number of copies.

From Table 2 it can also be derived that printing plate precursors according to the present invention show good stability at yellow light conditions.

The invention claimed is:

1. Radiation-sensitive composition comprising
   (a) one or more types of monomers and/or oligomers and/or polymers, each comprising at least one ethylenically unsaturated group accessible to a free-radical polymerization,
   (b) at least one sensitizer,
   (c) at least one coinitiator capable of forming free radicals together with the sensitizer (b) and selected from the following classes of compounds: metallocenes; 1,3,5-triazine derivatives with one to three $CX_3$ groups, wherein X represents chlorine or bromine; peroxides; hexaarylbiimidazoles; oxime ethers; oxime esters; N-aryl glycines and derivatives thereof; thiol compounds; N-aryl, S-aryl and O-aryl polycarboxylic acids with at least 2 carboxyl groups of which at least one is bonded to the N, S or O atom of the aryl unit; alkyltriarylborates; benzoin ethers; benzoin esters; trihalogenomethylarylsulfones; amines; N,N-dialkylaminobenzoic acid esters; aromatic sulfonyl halides; trihalogenomethylsulfones; imides; diazosulfonates; 9,10-dihydro-anthracene derivatives; α-hydroxy and α-amino acetophenones; and
   (d) optionally one or more components selected from alkali-soluble binders, colorants, exposure indicators, plasticizers, chain transfer agents, leuco dyes, surfactants, inorganic fillers and thermopolymerization inhibitors,
   characterized in that the at least one sensitizer is an oxazole derivative of the formula (I)

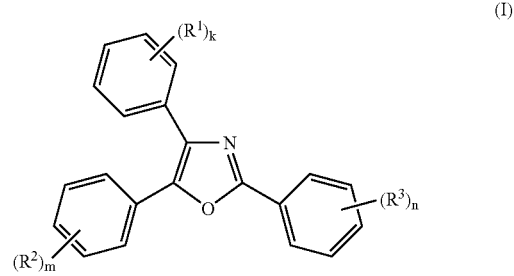

(I)

wherein each $R^1$, $R^2$ and $R^3$ is independently selected from a halogen atom, an optionally substituted alkyl group, an optionally substituted aryl group, which may also be fused, an optionally substituted aralkyl group, a group —NR⁴R⁵ and a group —OR⁶, wherein R⁴ and R⁵ are independently selected from a hydrogen atom, an alkyl, aryl or aralkyl group, R⁶ is an alkyl, aryl or aralkyl group or a hydrogen atom and k, m and n are independently 0 or an integer from 1 to 5.

2. Radiation-sensitive composition according to claim 1, wherein an oxazole derivative of formula (I) in used as a sensitizer and k, m and n are independently selected from 0 and 1.

3. Radiation-sensitive composition according to claim 1 wherein the stabilizer is a 1,3-oxazole of the formula (I) wherein at least one of the groups R¹, R² and R³ represents a group —NR⁴R⁵.

4. Radiation-sensitive composition according to claim 1, wherein the coinitiator (c) is selected from metallocenes, triarylimidazolyl dimers and mixtures thereof.

5. Radiation-sensitive composition according to claim 1, additionally comprising one or more onium salts.

6. Radiation-sensitive element comprising
(a) an optionally pretreated substrate and
(b) a radiation-sensitive coating consisting of a composition as defined in claim 1 applied on the substrate.

7. Radiation-sensitive element according to claim 6, wherein the substrate is an aluminum foil or plate.

8. Radiation-sensitive element according to claim 7, wherein prior to coating, the aluminum plate or foil is subjected to at least one treatment selected from graining, anodizing and hydrophilizing.

9. Radiation-sensitive element according to claim 6, wherein the element furthermore comprises an oxygen-impermeable overcoat.

10. Process for imaging a radiation-sensitive element comprising
(a) providing a radiation-sensitive element as defined in claim 6;
(b) image-wise irradiation of the element with UV radiation of >300 nm;
(c) optionally heating of the irradiated element;
(d) removing the non-irradiated areas of the coating by means of an aqueous alkaline developer;
(e) optionally heating the developed element and/or subjecting it to overall exposure.

11. Process according to claim 10, wherein the image-wise irradiation is carried out with UV radiation of a wavelength in the range of 350 to 450 nm.

12. Imaged element obtainable according to the process of claim 10.

13. Imaged element according to claim 12, wherein the element is a lithographic printing form.

14. Process for producing a radiation-sensitive element comprising
(a) providing an optionally pretreated substrate,
(b) providing a radiation-sensitive composition comprising
(i) one or more types of monomers and/or oligomers and/or polymers, each comprising at least one ethylenically unsaturated group accessible to a free-radical polymerization,
(ii) at least one sensitizer,
(iii) at least one coinitiator capable of forming free radicals together with the sensitizer (b) and selected from the following classes of compounds: metallocenes; 1,3,5-triazine derivatives with one to three CX₃ groups, wherein X represents chlorine or bromine; peroxides; hexaarylbiimidazoles; oxime ethers; oxime esters; N-aryl glycines and derivatives thereof; thiol compounds; N-aryl, S-aryl and O-aryl polycarboxylic acids with at least 2 carboxyl groups of which at least one is bonded to the N, S or O atom of the aryl unit; alkyltriarylborates; benzoin ethers; benzoin esters; trihalogenomethylarylsulfones; amines; N,N-dialkylaminobenzoic acid esters; aromatic sulfonyl halides; trihalogenomethylsulfones; imides; diazosulfonates; 9,10-dihydroanthracene derivatives; α-hydroxy and α-amino acetophenones; and
(iv) optionally one or more components selected from alkali-soluble binders, colorants, exposure indicators, plasticizers, chain transfer agents, leuco dyes, surfactants, inorganic fillers and thermopolymerization inhibitors,
(v) at least one solvent,
characterized in that the sensitizer is an oxazole derivative of the formula (I)

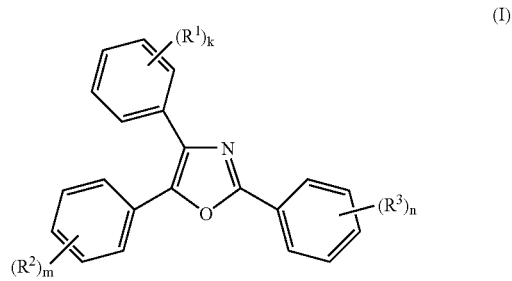

wherein each R¹, R² and R³ is independently selected from a halogen atom, an optionally substituted alkyl group, an optionally substituted aryl group, which may also be fused, an optionally substituted aralkyl group, a group —NR⁴R⁵ and a group —OR⁶, wherein R⁴ and R⁵ are independently selected from a hydrogen atom, an alkyl, aryl or aralkyl group, R⁶ is an alkyl, aryl or aralkyl group or a hydrogen atom and k, m and n are independently 0 or an integer from 1 to 5;

c) applying the radiation-sensitive composition provided in step (b) onto the substrate provided in step (a);

d) drying.

15. Process according to claim 14, wherein the substrate provided in step (a) is an aluminum substrate that has been subjected to at least one treatment selected from graining, anodizing and application of a hydrophilizing layer.

* * * * *